US006869873B2

(12) United States Patent
Bradshaw et al.

(10) Patent No.: US 6,869,873 B2
(45) Date of Patent: Mar. 22, 2005

(54) COPPER SILICIDE PASSIVATION FOR IMPROVED RELIABILITY

(75) Inventors: Robert Wayne Bradshaw, Ocoee, FL (US); Daniele Gilkes, Pompano Beach, FL (US); Sailesh Mansinh Merchant, Orlando, FL (US); Deepak A. Ramappa, Orlando, FL (US); Kurt George Steiner, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/609,889

(22) Filed: Jun. 30, 2003

(65) Prior Publication Data

US 2004/0097075 A1 May 20, 2004

Related U.S. Application Data

(62) Division of application No. 10/133,782, filed on Apr. 26, 2002, now abandoned, which is a continuation of application No. 09/454,003, filed on Dec. 3, 1999, now abandoned.

(51) Int. Cl.⁷ ..................... H01L 21/4763; H01L 21/44

(52) U.S. Cl. ........................ 438/630; 655/682; 655/687

(58) Field of Search ................................. 438/655, 682, 438/687, 630

(56) References Cited

U.S. PATENT DOCUMENTS

| | | | |
|---|---|---|---|
| 5,447,887 A | 9/1995 | Filipiak et al. | 437/200 |
| 5,491,365 A | 2/1996 | Chin et al. | 257/751 |
| 5,625,231 A | 4/1997 | Huang et al. | 257/751 |
| 5,773,639 A | 6/1998 | Kawaguchi et al. | 556/113 |
| 6,156,655 A | 12/2000 | Huang et al. | 438/687 |
| 6,181,013 B1 | 1/2001 | Liu et al. | 257/762 |
| 6,251,775 B1 * | 6/2001 | Armbrust et al. | 438/644 |
| 6,255,217 B1 | 7/2001 | Agnello et al. | 438/687 |
| 6,303,505 B1 | 10/2001 | Ngo et al. | 438/687 |
| 6,436,824 B1 * | 8/2002 | Chooi et al. | 438/687 |
| 6,515,367 B1 | 2/2003 | Bernard et al. | 257/758 |
| 2002/0155702 A1 | 10/2002 | Aoki et al. | 438/653 |

FOREIGN PATENT DOCUMENTS

| | | | | |
|---|---|---|---|---|
| EP | 1282168 A3 | 7/2002 | | H01L/23/532 |
| JP | 04-192527 | 11/1990 | | H01L/21/3205 |
| JP | 11-087499 | 9/1997 | | H01L/21/768 |

* cited by examiner

Primary Examiner—T. N. Quach
(74) Attorney, Agent, or Firm—F. M. Romano

(57) ABSTRACT

A silane passivation process, carried out in-situ together with the formation of a subsequent dielectric film, converts the exposed Cu surfaces of a Cu interconnect structure, to copper silicide. The copper silicide suppresses Cu diffusion and electromigration and serves as a barrier material in regions where contact to further conductive material is made. An entire copper surface of a copper interconnect structure may be silicided or a local portion of the surface silicided after an opening is formed in an overlying dielectric to expose a portion of the copper surface.

9 Claims, 6 Drawing Sheets

COPPER SILICIDE PASSIVATION FOR IMPROVED RELIABILITY

This application is a divisional of Ser. No. 10/133,782 filed on Apr. 26, 2002, abandoned, which is a continuation of Ser. No. 09/454,003, filed on Dec. 3, 1999, abandoned.

FIELD OF THE INVENTION

The present invention relates generally to semiconductor integrated circuits and methods for forming the same. More particularly, the present invention is related to suppressing copper diffusion within semiconductor integrated circuits and the like.

BACKGROUND OF THE INVENTION

The use of copper interconnect features is becoming increasingly popular in semiconductor integrated circuit devices and the like. Copper interconnect features such as vias and interconnect leads (also known as wires) are commonly formed using damascene processing methods. The use of copper as an interconnect material provides for increased device speed, and copper interconnect features include reduced line resistance compared to conventionally used materials such as aluminum and its alloys. Copper, however, has very high diffusion rates in metals and dielectrics, even at low temperatures. Copper diffusion can lead to leakage and reliability failures. One approach to preventing such copper diffusion and failures includes the introduction of barrier materials such as tantalum and tantalum nitride within the vias, trenches, and other openings in which the damascene copper interconnect structures are conventionally formed. The barrier materials encapsulate the copper within the openings. After a polishing operation is carried out to planarize the structure and form the damascene copper interconnect feature within the dielectric, however, the upper, polished copper surface is exposed. If this exposed copper surface is not encapsulated or otherwise covered, copper from the exposed copper surface may diffuse into or through conductive and/or dielectric materials formed over the copper interconnect structure.

One conventional technique for covering the copper surface and preventing copper diffusion is to form a silicon nitride or silicon carbide layer over the entire structure (including over the copper surface) prior to the subsequent deposition of further dielectric films over the copper structure. The silicon nitride or silicon carbide layer then necessarily forms part of the superjacent dielectric stack. This multilayered dielectric stack ostensibly requires additional processing operations to form the silicon nitride or silicon carbide layer. Furthermore, copper diffusion or electromigration may occur along the silicon carbide/copper or silicon nitride/copper interface and lead to reduced device reliability.

What is therefore required in the art is a method and structure for preventing copper electromigration along the copper/dielectric interface and copper diffusion into and through overlying dielectric and conductive materials.

SUMMARY OF THE INVENTION

The present invention provides a method for directly passivating exposed copper surfaces of a copper interconnect structure by converting the surfaces to copper silicide. A thin copper silicide layer formed directly on the copper interconnect structure prevents copper diffusion and electromigration, and also serves as a barrier layer in contacts formed to couple the copper interconnect structure to other conductive features. In one embodiment, the copper surface may be passivated by silane during an in-situ sequence in which an overlying dielectric layer, such as silicon nitride or silicon carbide, is also formed over the copper interconnect structure. According to this embodiment, the passivation or copper silicidation may be carried out such that copper silicide is formed on the entire upper surface of the copper interconnect structure.

In another exemplary embodiment, the present invention provides for furnishing an upper copper surface, forming a dielectric layer over the surface, forming an opening through the dielectric layer thereby exposing a portion of the upper copper surface, then locally passivating the exposed portion of the upper copper surface by converting it to a copper silicide material.

In another exemplary embodiment, the present invention provides a semiconductor product, including a copper interconnect structure formed over a substrate and including a top surface, in which at least a portion of the top surface is copper silicide formed as a result of silicon complexing with copper of the copper interconnect structure.

BRIEF DESCRIPTION OF THE DRAWING

The present invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like elements throughout the figures and specification. Included in the drawing are the following figures.

DETAILED DESCRIPTION OF THE INVENTION

Figure 1:
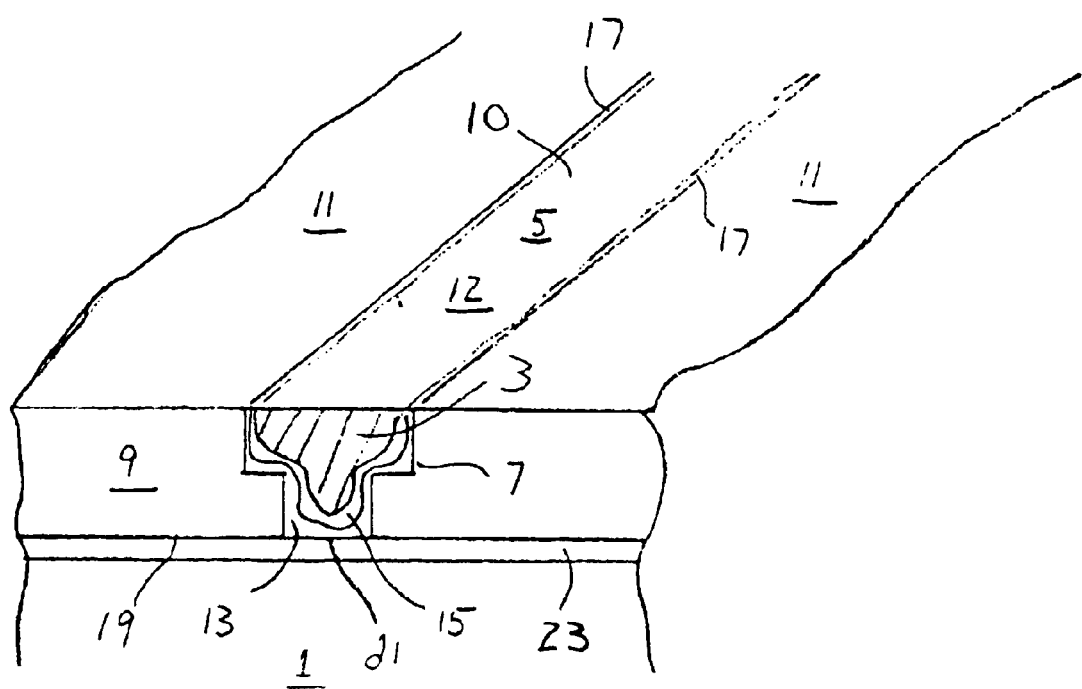
FIG. 1 is a cross-sectional and perspective view of an exemplary damascene copper interconnect lead.

The present invention provides for passivating exposed copper (Cu) surfaces of a copper interconnect structure, in a silicon environment such as silane, to convert the exposed portions of the copper surface to a copper silicide. The passivation process may alternatively be referred to as a silicidation process. The copper silicide is formed as the silicon penetrates the original copper surface and complexes with the copper therein. The copper silicide serves to prevent copper diffusion from the surface into any overlying material, such as overlying conductive materials and overlying dielectric materials. The copper silicide also serves as a metal-metal barrier layer in regions where the copper interconnect structure is contacted by a further conductive material in the copper silicide region. The copper silicide formed of the originally exposed copper surface also prevents copper electromigration along the interface formed between the copper surface and an overlying dielectric material such as silicon carbide, silicon nitride or various low-k dielectric materials. Such silicon carbide or silicon nitride materials are commonly formed over the copper interconnect structures formed using damascene processing technologies. Furthermore, the copper silicide suppresses hillock formation and improves adhesion to films formed to contact the copper silicide surface of the copper interconnect structure. The passivation of the copper surface carried out by exposing the copper surface to silicon-containing chemistries such as silane, may advantageously be carried out in-situ with the process operation used to form the silicon nitride, silicon carbide, or other dielectrics over the copper interconnect structure.

The present invention also provides for the localized passivation of an exposed portion of a copper surface. According to this embodiment, a dielectric is formed over a copper surface, and an opening formed to extend through the dielectric and to expose a portion of the copper surface. The passivation process using the silicon chemistry is then carried out to convert the exposed portion of the copper surface, to copper silicide. A further conductive material may be formed in the opening and contacting the copper silicide region which serves as a barrier layer. Additional, separately formed barrier layers may optionally be used as part of the further conductive material. In this embodiment, the copper silicide region acts as a metal to metal diffusion barrier and also overcomes the problems associated with forming barrier layers within openings having high aspect ratios.

Although copper interconnect technology typically uses damascene processing techniques to form copper interconnect structures such as vias, interconnect lines and the like, techniques are presently being developed to pattern copper films formed over a surface using etching processes in conjunction with photolithographic techniques. The patterned copper then includes an exposed upper surface and exposed sidewalls similar to other patterned interconnect materials used in the art. The present invention provides for passivating all exposed surfaces of the patterned copper structure to form copper silicide on all surfaces, including the sidewalls, thereby passivating the copper interconnect structure so as to prevent copper diffusion and copper migration along the interface of a dielectric layer that is subsequently formed over the patterned copper structure. As in the first, non-localized passivation embodiment, this passivation/silicidation may advantageously be performed in-situ with the subsequent deposition of an overlying dielectric film.

FIG. 1 is a cross-sectional and perspective view of a copper interconnect structure formed using damascene techniques. In the illustrated embodiment of FIG. 1, the exemplary copper interconnect structure is copper interconnect lead 10, which travels longitudinally over substrate 1 and may provide contact between laterally separated features. Copper interconnect lead 10 is intended to be exemplary only and, in other exemplary embodiments, the copper structure which will be passivated/silicided according to the present invention may be a via or other conductive structure formed using damascene processing technology. In yet another exemplary embodiment, as will be shown in FIGS. 10 and 11, a photolithographically patterned and etched copper lead may be used.

Still referring to FIG. 1, copper interconnect lead 10 is formed over substrate 1 and, more specifically, is formed within opening 7 formed within dielectric material 9. Substrate 1 may be a semiconductor wafer such as formed of silicon, gallium arsenide or other suitable materials. Substrate 1, as designated in the illustrated embodiment, may also represent a dielectric or other layer formed over such a wafer. Dielectric material 9 may be a silicon-based dielectric, such as SiOC—H, it may be a spin-on aromatic carbon, it may be an organo-silicate-glass (OSG), it may be polyimide or PSG or any of various other suitable dielectrics used in conjunction with copper interconnect features.

In a preferred embodiment, dielectric material 9 will be a low-k dielectric material, that is, a material having a dielectric constant of less than 4.0. In the exemplary illustrated embodiment, opening 7 is a dual damascene opening formed within dielectric material 9. The dual damascene opening may be formed using conventional techniques and is intended to be exemplary only. In other exemplary embodiments, a single damascene structure may be used any may include various shapes. Although dielectric material 9 is shown as a unitary layer, dielectric material 9 may be comprised of multiple dielectric layers. For example, a separate dielectric layer may correspond to each of the tiers of dual damascene opening 7. In another embodiment, dielectric material 9 may be a multilayered stack of dielectrics including at least one hard mask layer which may assist in forming the exemplary dual damascene (two-tiered) opening 7. Opening 7 is shown to extend to bottom 19 of dielectric material 9 and contacting portion 21 of subjacent layer 23 formed over substrate 1. This is intended to be illustrative of the embodiment in which copper interconnect lead 10 electrically contacts a subjacent component as does a via. Such is intended to be exemplary only, and in other exemplary embodiments, opening 7 may take on other shapes and may not extend down to bottom 19 and, instead, may totally be entrenched within dielectric material 9. According to the illustrated embodiment, subjacent layer 23 may be a hard mask, a barrier layer, conductive material, dielectric material, or any of various materials, depending on the function and structure of copper interconnect lead 10. According to another exemplary embodiment, subjacent layer 23 may not be present.

In the illustrated embodiment, copper interconnect lead 10 is formed of a bulk copper portion 3, and two barrier layers 13 and 15. Conventional methods may be used to form the barrier layers and the bulk copper material over the barrier layers. The barrier layers effectively encapsulate the bulk copper portion 3 of copper interconnect lead 10, laterally and subjacently. In an exemplary embodiment, lower barrier layer 13 may be formed of tantalum, Ta, and upper barrier layer 15 may be formed of tantalum nitride, TaN. These films are intended to be exemplary only and in other exemplary embodiments, other barrier layers formed of titanium, titanium nitride, tungsten, and titanium tungsten may be used. According to other exemplary embodiments, various suicides may be used as a barrier layer. In various exemplary embodiments, only a single barrier layer is used. According to yet another exemplary embodiment, barrier layers are not included. The illustration of FIG. 1 shows the structure after polishing or other suitable damascene techniques have been used to substantially planarize the structure and form copper interconnect lead 10 within opening 7. Copper interconnect lead 10 includes upper surface 12 which is essentially planar and co-planar with top surface 11 of dielectric material 9. Upper surface 12 includes upper copper surface 5 and edges 17 which are formed of the barrier layers. Various polishing and other techniques available in the art may be used to form the structure shown in FIG. 1 after the optional barrier layer or layers then the bulk copper material 3 are formed within opening 7.

Figure 2:
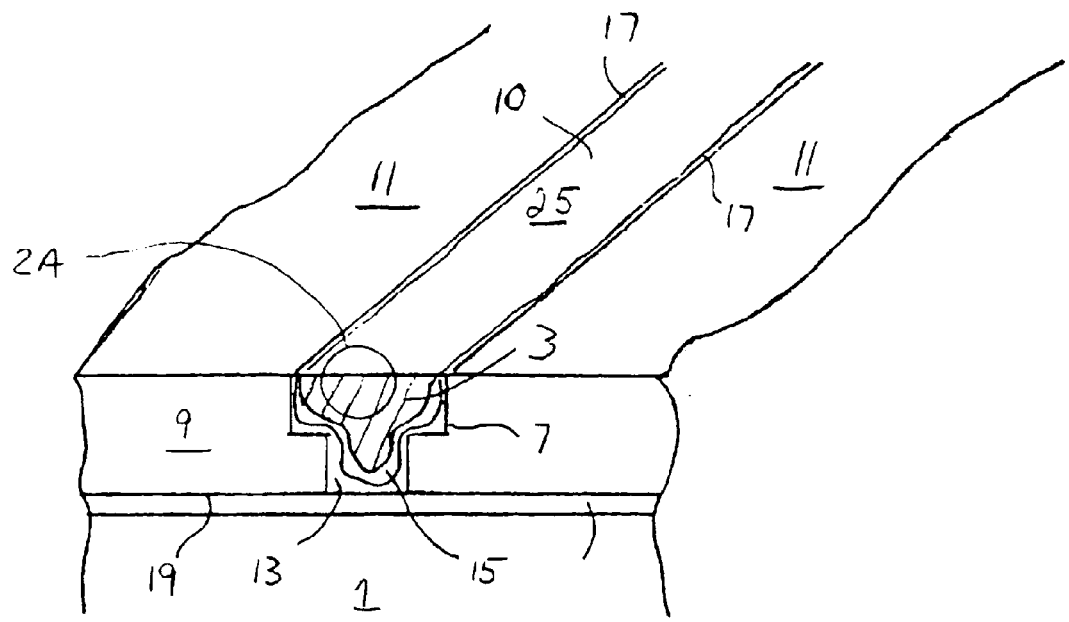
FIG. 2 shows the structure of FIG. 1 after the exposed copper surface has been converted to copper silicide.

The structure shown in FIG. 1 is then passivated to form the structure shown in FIG. 2. According to this exemplary embodiment, the entirety of upper copper surface is exposed and substantially all of upper copper surface 5 is converted to copper silicide using the passivation/silicidation process of the present invention. The passivation/silicidation process advantageously uses silane at a temperature within the range of 300–400° C. and including a flow rate which may range from 300 to 1,000 sccm, a pressure which may lie within the range of 1–10 torr, and RF plasma power within the range of 50–1,000 watts at 13.56 MHz. According to one exemplary embodiment, the silane flow rate may be about 300 sccm and the process may include a pressure of 5 torr, a temperature of 350° C., and an RF power ranging from 500–1000 watts. In other exemplary embodiments, gas chemistries using other Si sources may be used. Furthermore, the preceding values are exemplary only and according to other exemplary embodiments, different combinations of process parameters may be used to convert the exposed portions of upper copper surface 5 to copper silicide by causing the silicon from the plasma chemistry to penetrate the exposed Cu surface and react with the Cu therein. Various phases of copper silicide may be formed. The degree of silicidation may increase with time as appreciated by one of ordinary skill in the art. In one embodiment, the process may be carried out for a time ranging from 5–20 minutes but other processing times may be used depending on the degree of silicidation required.

FIG. 2 shows the structure shown in FIG. 1 after substantially the entire exposed upper copper surface 5 (shown in FIG. 1) has been converted to copper silicide surface 25. In other embodiments, at least a portion of the exposed region of upper copper surface 5 is converted to copper silicide surface 25. Compared to original Cu surface 5, copper silicide surface 25 is a rougher surface with increased surface area, and includes essentially no undesirable copper oxide. The increased surface area improves adhesion to films formed over and contacting copper silicide surface 25. Copper silicide surface 25 also includes, the advantage that it suppresses hillock formation in copper interconnect lead 10.

Figure 2A:
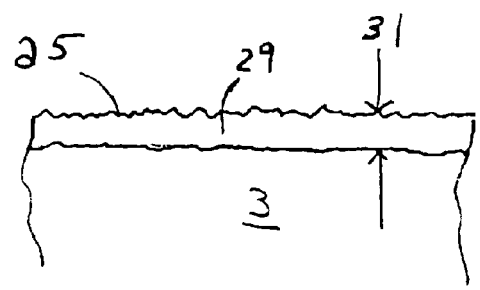
FIG. 2A is an expanded cross-sectional view of a portion of FIG. 2.

FIG. 2A is an expanded, cross-sectional view of the originally copper surface which has been converted to copper silicide. FIG. 2A shows that original upper copper surface 5 shown in FIG. 1 is converted to copper silicide surface 25 which includes copper silicide 29 that encroaches bulk copper material 3. Copper silicide 29 represents a converted portion of copper interconnect lead 10 in which silicon penetrates the original upper surface and complexes with the copper therein to form copper silicide. The processing parameters are chosen such that the copper silicide is formed by silicon from the silane or other silicon gas chemistry, penetrating the original upper copper surface 5 to complex with the Cu and thereby convert the upper portions of that surface to copper silicide 29. Copper suicide 29 may include a depth 31 ranging from 20–200 angstroms but other thicknesses may be used alternatively. One of ordinary skill in the art will appreciate that the process temperatures and process duration can be varied to control thickness 31 of copper silicide 29. Thickness 31 may be chosen in conjunction with the degree of silicidation desired, to be thick enough to prevent copper diffusion from the copper interconnect structure and thin enough to minimize the increase in sheet resistance of copper in interconnect lead 10. Copper silicide surface 25 is shown to be a rough and irregular surface in the illustrated embodiment. Such a rough and irregular surface provides the additional surface area that improves adhesion to films formed thereover.

An optional anneal of short duration may be carried within the temperature range of 350° C.–400° C. to reduce the sheet resistance of the copper interconnect lead and to reduce the contact resistance between copper silicide surface 25 and any further conductive materials which may be formed to contact copper silicide surface 25. This optional anneal may include an anneal time on the order of seconds or minutes. It is believed that the reduction of the sheet/contact resistance is achieved because the short duration anneal alters the phase of the copper silicide initially formed and/or because additional copper silicide formation occurs due to the excess of silicon. The anneal process may include nitrogen or other inert species. According to other exemplary embodiments, the annealing process may not be used.

FIG. 2 shows the structure after copper silicide surface 25 has been formed. According to one exemplary embodiment, this structure may be an intermediate structure as an advantage of the present invention is that the silicidation/passivation process of the present invention may be carried out in-situ, and together with the subsequent formation of a further film over the structure. The further film may be any of various dielectric films used to form a superjacent dielectric stack, and according to one exemplary embodiment, the first layer formed directly over the surface may be a silicon nitride or silicon carbide film formed in-situ with the silicidation/passivation process.

Figure 3:
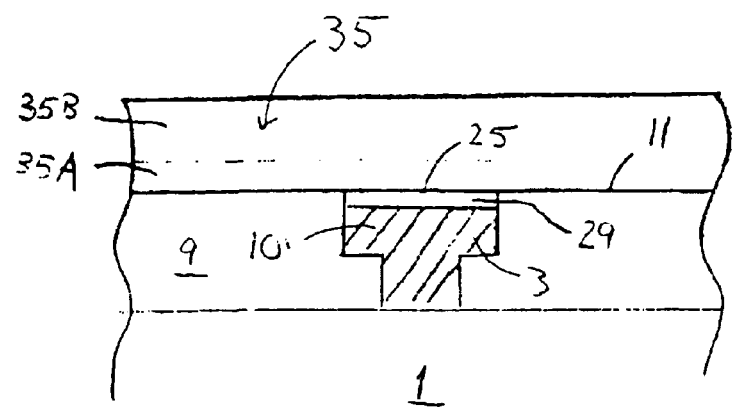
FIG. 3 is a cross-sectional view showing a dielectric material formed over the passivated copper silicide surface.

FIG. 3 is a cross-sectional view showing upper dielectric 35 formed over the substructure generally shown in FIG. 2, with the exception being that subjacent layer 23 and barrier layers 13 and 15 have been removed for clarity. It should be therefore understood that, although not illustrated, these features may be included in various embodiments such as the illustrated embodiment. Upper dielectric 35 is formed over top surface 11 and copper silicide surface 25 which includes copper suicide 29 as described above. Upper dielectric 35 may be a single dielectric film or it may represent a stack of dielectric layers some or all of which may be formed in-situ with the silicidation/passivation process. Low-k dielectric materials and Si-based materials may be used and the dielectric materials may be as discussed in conjunction with dielectric material 9 of FIG. 1. In one exemplary embodiment, upper dielectric 35 may be a composite or stack of multiple individual layers. Upper dielectric 35 may be formed of two layers 35A and 35B separated by the dashed line. According to this exemplary embodiment, dielectric layer 35A may be silicon nitride or silicon carbide and dielectric layer 35B may be a low-k dielectric material. This is intended to be exemplary only and in other exemplary embodiments, other numbers of various dielectric films may be used to form upper dielectric 35. A hardmask film or films may be included in upper dielectric 35. An aspect of the present invention is the improved adhesion between silicided copper silicide surface 25 and upper dielectric 35, particularly when the dielectric layer in contact with silicided copper silicide surface 25 is silicon nitride or silicon carbide.

Figure 4:
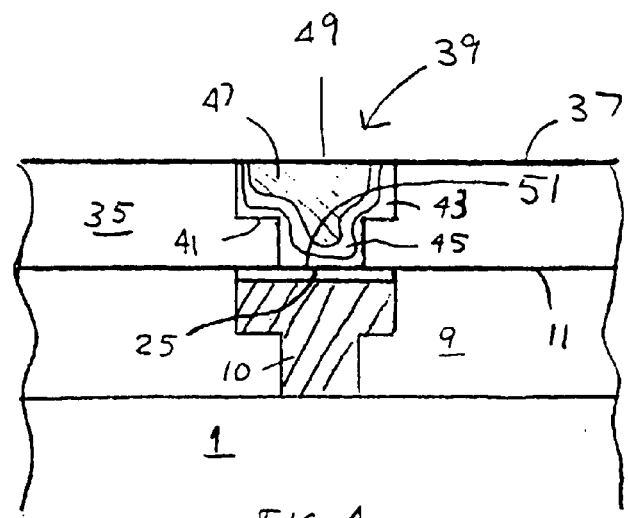
FIG. 4 is a cross-sectional view showing a conductive structure formed over the passivated copper silicide surface that was shown in FIG. 3.

FIG. 4 shows the structure of FIG. 3 after an exemplary conductive structure 39 has been formed to contact copper silicide surface 25 of copper interconnect lead 10 through the bottom of opening 41 formed in upper dielectric 35. Opening 41 extends to the bottom of upper dielectric layer 35 and exposes section 51 of copper silicide surface 25. In the exemplary embodiment, opening 41 is a dual damascene opening, but other openings may be used in other embodiments to provide for contact to copper silicide surface 25 of copper interconnect lead 10. Opening 41 only exposes a part of copper silicide surface 25. Other portions of copper silicide surface 25 remain covered by upper dielectric 35. (This is shown more clearly in FIG. 5.) Conductive structure 39 includes optional barrier layers 43 and 45 and bulk conductive material 47. Optional barrier layers 43 and 45 are similar to barrier layers 13 and 15, discussed in conjunction with copper interconnect lead 10 and bulk conductive material 47 may be copper or other suitable conductive materials. It is an advantage of the present invention that, according to one exemplary embodiment, optional barrier layers 43 and 45 are not needed because copper silicide surface 25 serves as a diffusion barrier between copper interconnect lead 10 and conductive structure 39. According to the illustrated exemplary embodiment, conductive structure 39 is a damascene structure which includes a planarized top surface 49 that is substantially co-planar with top surface 37 of upper dielectric 35. Various other damascene and non-damascene conductive structures may be used to contact copper silicide surface 25, in other exemplary embodiments.

Figure 5:
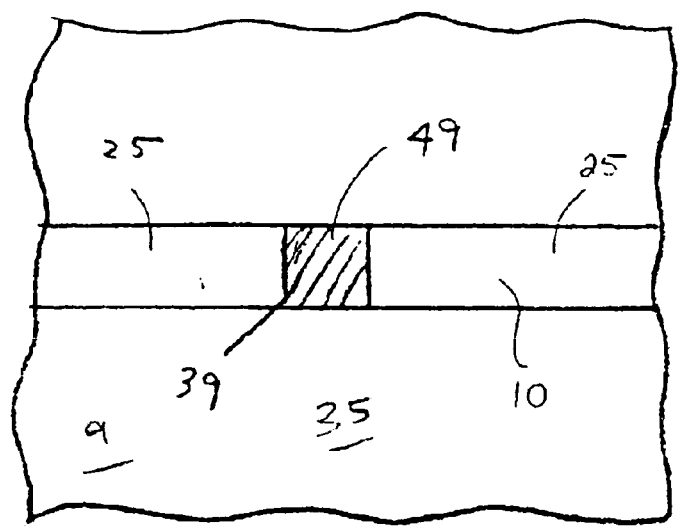
FIG. 5 is a plan view showing an exemplary conductive structure formed over a copper interconnect lead.

FIG. 5 is a plan view showing upper conductive structure 39 formed over and contacting copper interconnect lead 10 as shown in FIG. 4. In this exemplary embodiment, conductive structure 39 is a via formed within an opening (opening 41 shown in FIG. 4) that contacts section 51 of copper silicide surface 25 of copper interconnect lead 10. Other portions of copper silicide surface 25 are covered by upper dielectric 35. Optional barrier layers 43 and 45 are not illustrated in FIG. 5.

According to the illustrated exemplary embodiment, copper interconnect lead 10 is an interconnect wire that extends within a long trench that extends laterally through the device and conductive structure 39 is a via, but other arrangements may be used according to other exemplary embodiments. For example, contact may be made between two interconnect leads that traverse each other in a generally orthogonal relationship according to the exemplary embodiment in which the upper damascene interconnect structure extends to the bottom of the dielectric layer in which it is formed. Furthermore, the upper interconnect structure may be a non-damascene structure according to other exemplary embodiments.

Figure 6:
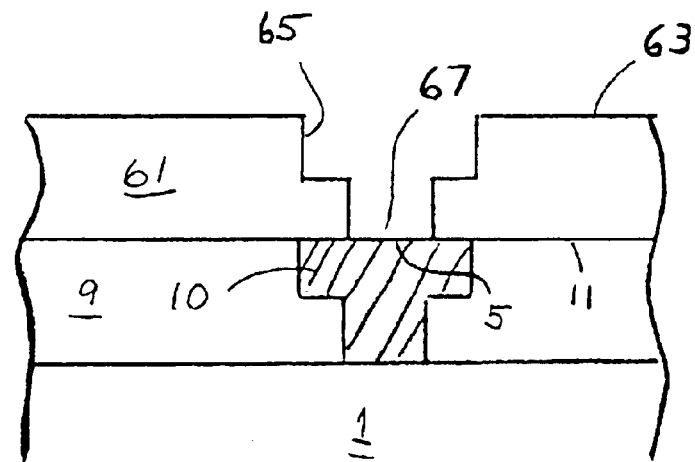
FIG. 6 is a cross-sectional view showing an opening formed through a dielectric and exposing a portion of a copper surface.

Another embodiment of the present invention is the local silicidation of an exposed copper surface. FIG. 6 is a cross-sectional view of an exemplary copper interconnect lead 10 formed within dielectric material 9. Second dielectric layer 61 is formed over upper copper surface 5 and top surface 11 of dielectric material 9. Second dielectric 61 may be any of various materials or stacks of layers of materials as previously discussed. For example, second dielectric 61 may include or be formed exclusively of Si-based, low-k dielectric layers and it may include at least one hard mask layer. Opening 65 is formed to extend through second dielectric 61 and exposes section 67 of upper copper surface 5. Although exemplary opening 65 is shown to be a dual damascene opening, various other openings may be formed in other exemplary embodiments. Exposed section 67 of upper copper surface 5 of copper interconnect lead 10 may then be passivated according to the passivation/silicidation process described above. The passivation/silicidation process is performed on the structure shown in FIG. 6, to form the structure shown in FIG. 7.

Figure 7:
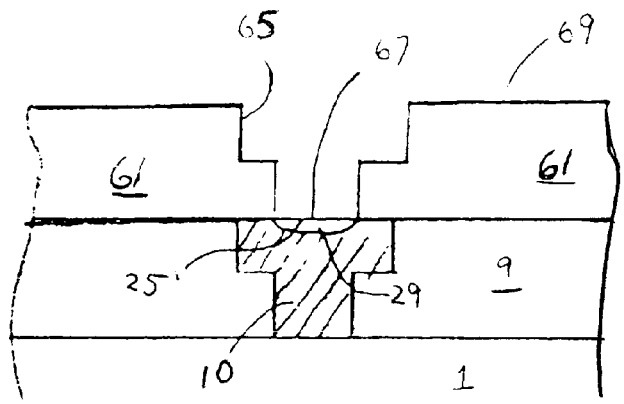
FIG. 7 shows the structure shown in FIG. 6 after a passivation process has been used to silicide the exposed copper surface.

FIG. 7 shows local copper silicide surface 25 formed in exposed section 67 of the originally copper upper surface of copper interconnect lead 10. Other non-exposed portions of upper copper surface 5, are not so passivated. Copper silicide 29 is formed to encroach Cu interconnect lead 10 as silicon penetrates the original copper upper surface and complexes with copper of copper interconnect lead 10, to convert the copper within exposed section 67 of upper copper surface 5, to copper silicide 29. In this embodiment, localized copper silicide 29 may serve as a barrier layer between copper interconnect lead 10 and a subsequently formed conductive structure which contacts copper interconnect lead 10. This overcomes the disadvantage of attempting to form a continuous barrier layer film within opening 65, to contact copper interconnect lead 10. According to the exemplary embodiment in which opening 65 has a high aspect ratio, barrier layer films formed using conventional methods tend to become discontinuous and develop void areas within the opening.

Figure 8:
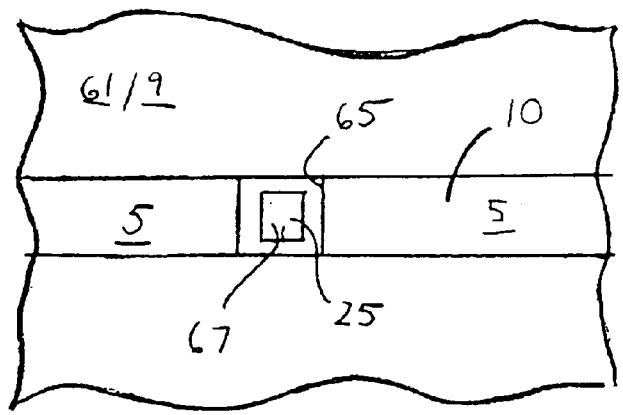
FIG. 8 is a plan view showing a locally silicided region of a copper interconnect wire.

FIG. 8 is a plan view of the structure shown in FIG. 7. FIG. 8 shows exemplary dual damascene opening 65 which will be used to form a via, aligned over copper interconnect lead 10. Local copper silicide surface 25 is formed substantially only in section 67, the exposed portion of original upper copper surface 5 of copper interconnect lead 10 that was converted to copper silicide. Other portions of upper copper surface 5 that are not exposed and locally slicided, remain as unconverted copper. In this manner then, second dielectric layer 61 shown in cross-section in FIG. 7, covers upper copper surface 5 and includes opening 65 therethrough which exposes section 67 of original upper copper surface 5 that has been converted to copper silicide surface 25 in section 67 only. Opening 65 therefore defines the localized portion of the upper copper surface that is converted to copper silicide.

Figure 9:
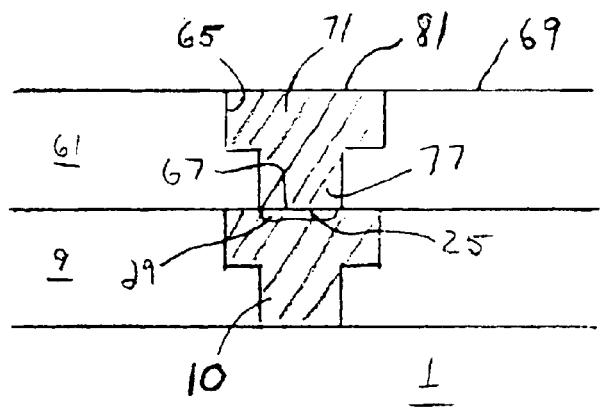
FIG. 9 is a cross-sectional view showing a conductive damascene structure formed in the opening shown in FIG. 7.

FIG. 9 shows upper conductive structure 71 formed within opening 65 to contact localized copper silicide surface 25 at section 67. Upper conductive structure 71 includes bulk conductive material 77 and may be formed using conventional methods. Bulk conductive material 77 may be copper, aluminum or other suitable conductive materials. In the illustrated embodiment, upper conductive structure 71 is a via and may be formed using damascene processing such that top surface 81 is essentially co-planar with upper surface 69 of second dielectric 61. According to other exemplary embodiments, upper conductive structure 71 may be any of other damascene structures, such as an interconnect lead, which contacts copper silicide surface 25. According to yet another exemplary embodiment, a non-damascene structure may be formed to fill opening 65 which defines the local portion (section 67) of original upper copper surface 5 which is converted to copper silicide surface 25. It is therefore an advantage of the present invention that a barrier layer—copper silicide 29, is formed between copper interconnect lead 10 and upper conductive structure 71 without having to deposit a film into an opening such as opening 65 which may include a high aspect ratio rendering it difficult to form a continuous barrier layer film in the opening. In other exemplary embodiments, additional barrier layers may be used together with copper silicide 29.

Figure 10:
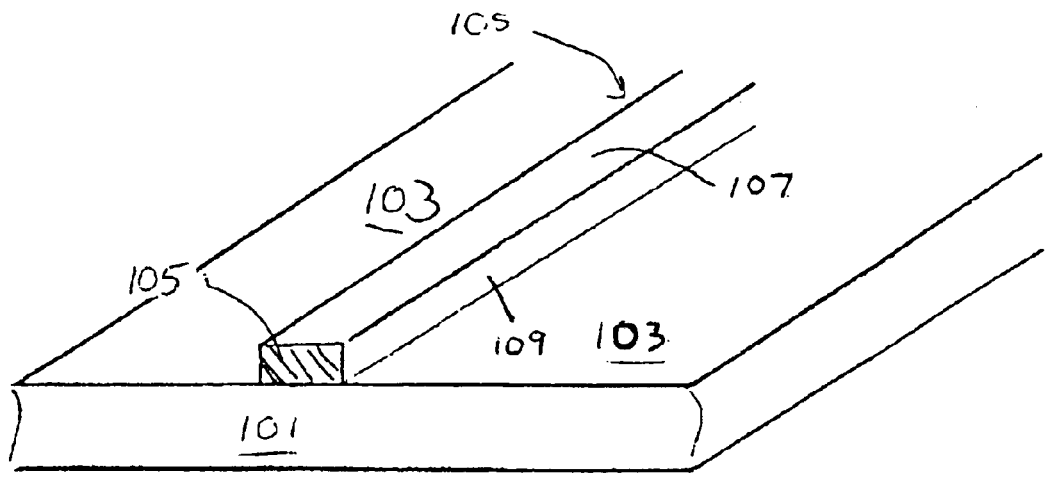
FIG. 10 is a cross-sectional and perspective view of a copper wire formed over a surface.

FIG. 10 is a perspective cross-sectional view of copper interconnect wire 105 formed over surface 103 of layer 101. Layer 101 may be a dielectric or other layer formed over a substrate, or over other semiconductor structures. Copper interconnect wire 105 may be formed using various techniques such as photolithography and patterning and etching procedures presently being developed in the art. It is contemplated that improved methods for patterning and etching copper will continue to be developed in the art. Patterned copper interconnect wire 105 includes top surface 107 and sidewalls 109, each composed of copper.

The silicidation/passivation process of the present invention, as described above, may advantageously be used to passivate the exposed surfaces (top surface 107 and sidewalls 109) of copper interconnect wire 105. As a result of the passivation process, the sidewalls and top surface of copper interconnect wire 105 are converted to copper silicide.

Figure 11:
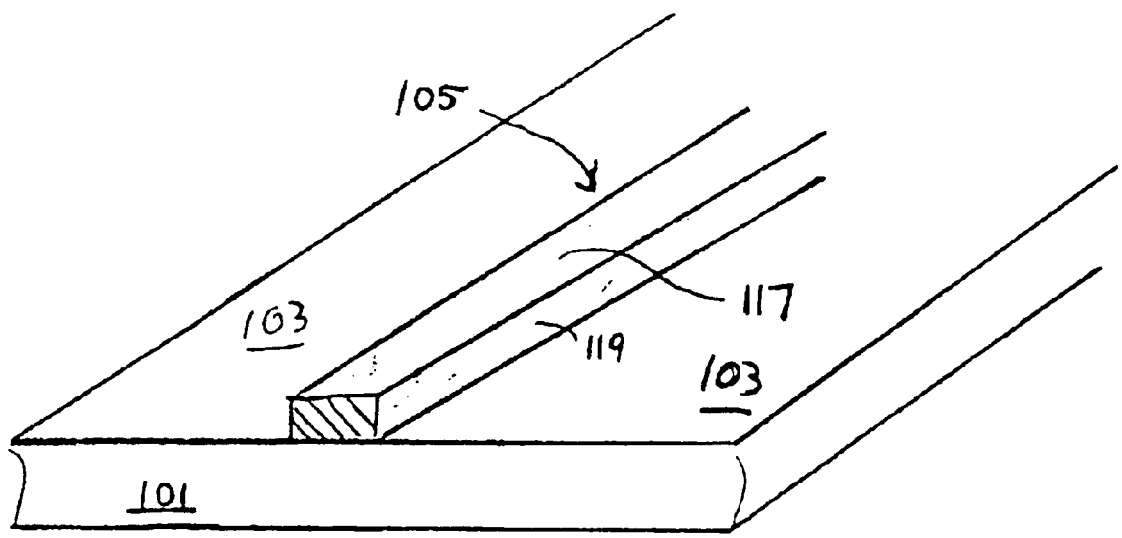
FIG. 11 shows the structure of FIG. 10 after copper silicide has been formed on exposed copper surfaces.

FIG. 11 shows converted sidewalls 119 and converted top surface 117 that are now copper silicide surfaces including copper silicide as shown and described in previous embodiments. The silicided structure shown in FIG. 11 enjoys the advantage of reduced copper diffusion from copper interconnect wire 105 because copper silicide surfaces 119 and 117 suppress such out-diffusion. Copper silicide surfaces 117 and 119 also suppress electromigration of copper along the boundary formed between copper interconnect wire 105 and dielectric or other materials formed thereover. Adhesion of subsequently formed materials, particularly silicon nitride and silicon carbide, to copper interconnect wire 105, is improved due to the copper silicide. Hillock formation is suppressed. Various conductive materials which may optionally include barrier layers may be formed to contact the copper silicide regions formed in silicided surfaces 117 and 119. In other embodiments, additional barrier layers are not used since the copper silicide surfaces of copper interconnect wire 105 act as barrier materials.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A plasma-based reaction method for forming a semiconductor product comprising:

forming a Cu interconnected structure over a substrate, said Cu interconnect structure including an exposed Cu surface, and converting at least a portion of said exposed Cu surface to copper silicide under plasma reaction conditions with a gaseous material comprising Si, wherein forming the Cu interconnect structure includes forming a Cu interconnect structure having an upper Cu surface, forming a dielectric layer over said upper Cu surface and forming an opening in said dielectric layer thereby exposing an exposed portion of said upper Cu surface that forms said exposed Cu surface, and wherein said converting includes converting said exposed Cu surface to said copper silicide.

2. The method as in claim 1, further comprising, after said converting, filling said opening with a conductive material, then polishing to remove portions of said conductive material from over said dielectric.

3. The method as in claim 1, in which said converting comprises passivating with silane thereby causing Si to penetrate said exposed Cu surface and complex with said Cu therein.

4. The method as in claim 1, in which said forming a Cu interconnect structure comprises forming said Cu interconnect structure using damascene processing techniques, said Cu interconnect structure formed within a lower dielectric having a top surface that is substantially co-planar with said upper Cu surface.

5. The method as in claim 1, in which said forming a dielectric layer comprises forming a silicon carbide film, then forming a low-k dielectric film thereover, said dielectric layer therefore comprising a composite structure.

6. The method of claim 1 wherein the step of forming a dielectric layer over said copper interconnect structure comprises forming a silicon carbide film.

7. The method of claim 1 wherein the plasma reaction conditions are created with gaseous material comprising silane.

8. The method of claim 1 wherein the step of forming a dielectric layer includes forming a dielectric layer comprising silicon carbide over the copper interconnect structure.

9. The method of claim 1 wherein the step of forming a dielectric layer includes forming a dielectric layer comprising SiOC—H.

* * * * *